US007884468B2

United States Patent
Mann et al.

(10) Patent No.: US 7,884,468 B2
(45) Date of Patent: Feb. 8, 2011

(54) COOLING SYSTEMS FOR POWER SEMICONDUCTOR DEVICES

(75) Inventors: Brooks S Mann, Torrance, CA (US); George R. Woody, Redondo Beach, CA (US); Terence G. Ward, Redondo Beach, CA (US); David F. Nelson, Agoura Hills, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 167 days.

(21) Appl. No.: 12/178,489

(22) Filed: Jul. 23, 2008

(65) Prior Publication Data
US 2009/0032937 A1 Feb. 5, 2009

Related U.S. Application Data

(60) Provisional application No. 60/952,743, filed on Jul. 30, 2007.

(51) Int. Cl.
*H01L 23/34* (2006.01)
(52) U.S. Cl. .............................. 257/714; 257/E23.098
(58) Field of Classification Search .................. 257/714
See application file for complete search history.

(56) References Cited

U.S. PATENT DOCUMENTS

| 5,016,090 A | * | 5/1991 | Galyon et al. ............... 257/714 |
| 5,959,351 A | * | 9/1999 | Sasaki et al. ................ 257/714 |

* cited by examiner

*Primary Examiner*—David A Zarneke
*Assistant Examiner*—Jenny L Wagner
(74) *Attorney, Agent, or Firm*—Ingrassia Fisher & Lorenz, P.C.

(57) ABSTRACT

A cooling device is provided for liquid cooling a power semiconductor device. The device includes a coolant diverter for guiding liquid coolant to the power semiconductor device. The coolant diverter has a first plate for dividing the coolant diverter into a first cavity and a second cavity. The second cavity positioned adjacent the power semiconductor device. The first plate further includes an opening to fluidly couple the first cavity with the second cavity such that the liquid coolant flows into the first cavity, through the opening in the first plate, and into the second cavity to cool the power semiconductor device. The first cavity has a cross-sectional area that generally decreases in a downstream direction, and the second cavity has a cross-sectional area that generally increases in the downstream direction.

8 Claims, 2 Drawing Sheets

COOLING SYSTEMS FOR POWER SEMICONDUCTOR DEVICES

CROSS REFERENCE TO RELATED APPLICATIONS

This application claims the benefit of U.S. Provisional Application No. 60/952,743, filed Jul. 30, 2007, which is incorporated herein by reference in its entirety.

TECHNICAL FIELD

The present invention generally relates to cooling systems for power semiconductor devices, and more particularly relates to coolant diverters for direct jet impingement cooling of the substrates associated with power semiconductor devices.

BACKGROUND OF THE INVENTION

Semiconductor devices are commonly utilized as switches or rectifiers in high-power electric circuits. As one example, power inverters are used in electric and hybrid electric vehicles to provide three phase operating power to the electric drive motor of the vehicle. These semiconductor devices may generate excess heat during operation. For example, the power demands of electric traction motors may fluctuate over a wide range. These fluctuations in power demand can cause temperature changes in the semiconductor devices connected to the traction motors, which may result in degradation from the heat itself or from variations in the coefficients of expansion between the constituent materials.

For this reason, the power modules that house such semiconductor devices are often provided with some form of cooling system. Conventional cooling systems commonly employ a cold plate (e.g., a heat sink) to transfer heat away from the semiconductor device. The heat sink may include a metal body (e.g., aluminum, copper, etc.) having a flat surface and any number of projections ("pin-fins") extending away from semiconductor device. The flat surface of the heat sink is placed in thermal contact with the semiconductor device (e.g., soldered to a substrate supporting the semiconductor device), and the pin-fins are exposed to a cooling source, typically air or a coolant fluid (e.g., glycol water). Some cooling systems include a pump to circulate coolant fluid through the module. During operation, heat is conducted away from the semiconductor device and into the pin-fins, which are convectively cooled by the cooling medium.

Conventional cooling systems may not adequately cool the power semiconductor devices in all situations. Particularly, conventional cooling systems may be unable to properly direct coolant to certain areas, including those areas that may be in greatest need of additional cooling. This can be a result of the inability to direct fresh coolant to the various portions of the semiconductor devices or the presence of intervening layers such as interconnects and insulating layers. Additionally, many conventional cooling systems can be difficult to manufacture, overly-complicated, and expensive.

Accordingly, it is desirable to provide power modules with semiconductor devices and cooling systems that enable satisfactory cooling. In addition, it is desirable to providing cooling systems with coolant diverters that direct coolant to the most appropriate locations and that are relatively easy and inexpensive to manufacture. Furthermore, other desirable features and characteristics of the present invention will become apparent from the subsequent detailed description and the appended claims, taken in conjunction with the accompanying drawings and the foregoing technical field and background.

SUMMARY OF THE INVENTION

In accordance with an exemplary embodiment, a cooling device is provided for liquid cooling a power semiconductor device. The device includes a coolant diverter for guiding liquid coolant to the power semiconductor device. The coolant diverter has a first plate for dividing the coolant diverter into a first cavity and a second cavity. The second cavity positioned adjacent the power semiconductor device. The first plate further includes an opening to fluidly couple the first cavity with the second cavity such that the liquid coolant flows into the first cavity, through the opening in the first plate, and into the second cavity to cool the power semiconductor device. The first cavity has a cross-sectional area that generally decreases in a downstream direction, and the second cavity has a cross-sectional area that generally increases in the downstream direction.

In accordance with another exemplary embodiment, a coolant diverter of a cooling system for a semiconductor device includes two side walls; and a plate extending between the side walls and angled such that the coolant diverter is generally wedge-shaped.

In accordance with yet another exemplary embodiment, a power module includes a housing; a semiconductor device positioned within the housing and including a die of insulated gate bipolar transistors (IGBTs) mounted on a substrate; and a cooling system in proximity to the semiconductor device for providing a liquid coolant to the semiconductor device. The cooling system includes a coolant diverter having a first plate that forms a first cavity with the housing and a second cavity with the semiconductor device. The first plate further includes nozzles to fluidly couple the first cavity with the second cavity, the first plate being angled such that a cross-sectional area of the first cavity decreases in a downstream direction of liquid coolant flow.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Broadly, exemplary embodiments disclosed herein include cooling systems for semiconductor devices in power modules. More specifically, exemplary embodiments of the cooling systems include a coolant diverter that is wedge-shaped such that coolant is evenly distributed across the nozzles.

Figure 1:
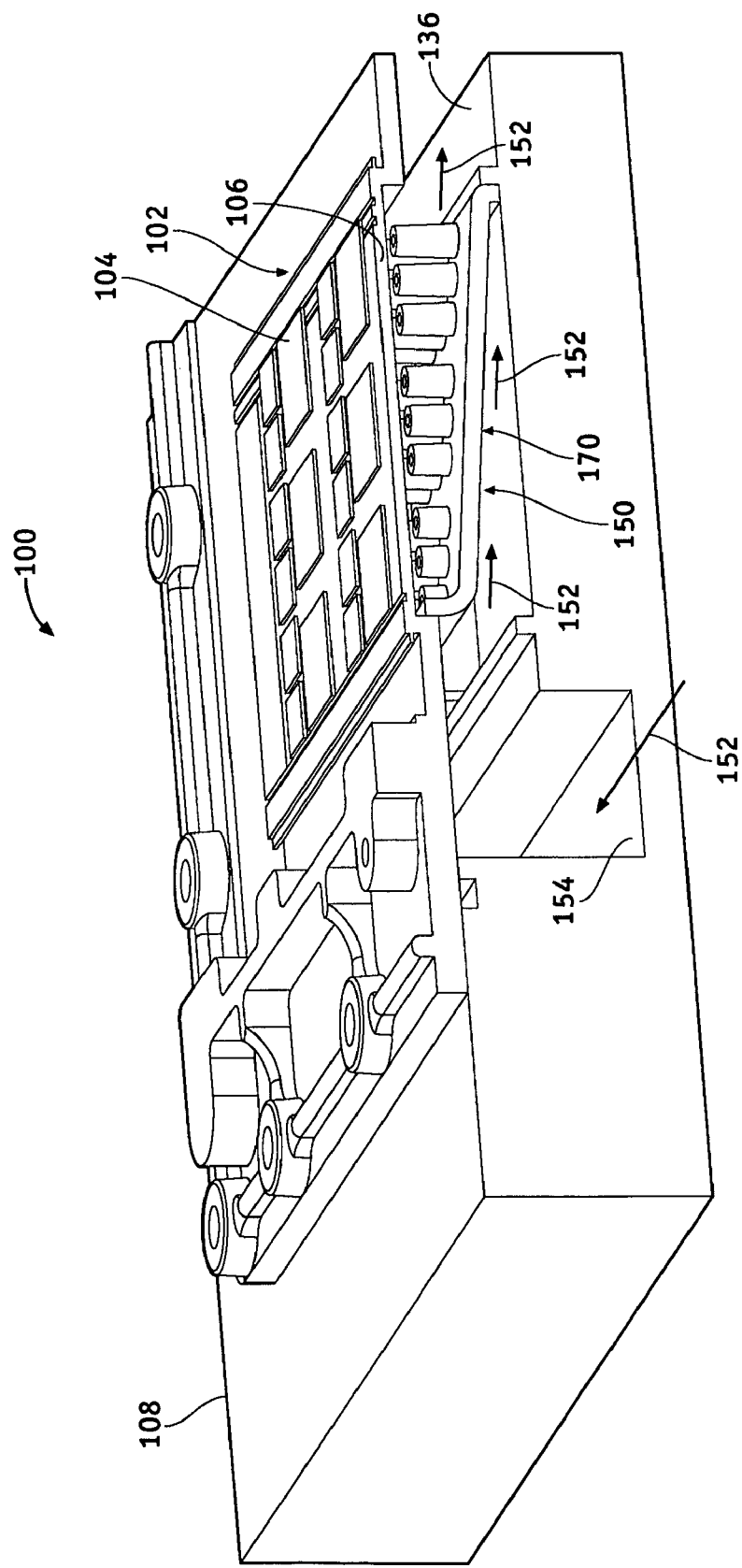
FIG. 1 is a partial, isometric cross-sectional view of a power module in accordance with an exemplary embodiment.

FIG. 1 is a partial, isometric cross-sectional view of a power module 100 in accordance with an exemplary embodiment. The power module 100 is suitable for use on an electric or hybrid vehicle, for example, with a three-phase, alternating current (AC) electric motor. The power module 100 includes one or more semiconductor devices 102 arranged within a housing 108. In one embodiment, the semiconductor device 102 can be an inverter circuit that supplies switched alternating current to the AC electric motor, and include one or more die of insulated gate bipolar transistors (IGBTs) 104 mounted on a substrate 106 such as direct bond copper (DBC).

During operation of the power module 100, the semiconductor device 102, particularly the IGBTs 104, generate heat. A cooling system 150 is consequently provided within the housing 108 to dissipate the heat by actively circulating a coolant fluid, indicated by arrows 152, through the housing 108 and onto the substrate 106 of the semiconductor device 102. In one embodiment, the coolant fluid 152 impinges directly onto the substrate 106. Particularly, the cooling system 150 includes an inlet flow passage 154 defined in the housing 108 that directs the coolant 152 to a coolant diverter 170. The coolant diverter 170 then redirects the coolant 152 such that jets 184 of the coolant 152 directly impinge on the underside of semiconductor device 102 to conductively absorb excessive heat. The coolant diverter 170 is discussed in greater detail below with reference to FIGS. 2 and 3. After contacting the underside of semiconductor device 102, the coolant 152 drains from the coolant diverter 170 into an outlet flow passage 156 defined in the housing 108.

Although not illustrated, the cooling system 150 can further include a reservoir for draining coolant 152 from the outlet flow passage 156 and for providing coolant 152 to the inlet flow passage 154. The cooling system 150 can further include a pump fluidly coupled to the inlet flow passage 154 and outlet flow passage 156 for actively circulating the coolant 152. The pump may be a variable speed pump that is controlled in conjunction with the output of the IGBTs 104. As the output of the IGBTs 104 increases, the speed of the pump may increase to increase circulation of coolant 152. Alternatively, the temperature of the IGBTs 104 may be monitored with a thermocouple arrangement such that the speed of the pump is dependant on the measured temperature. The cooling system 150 can be dedicated to the power module 100, or it can be part of a larger system, such as the cooling system for an automobile.

The coolant 152 can be any suitable liquid, including liquids that are not dielectric since the substrate 106 is typically not electrically active. For example, the coolant 152 can be water, everyday engine coolant, or automatic transmission fluid.

Figure 2:
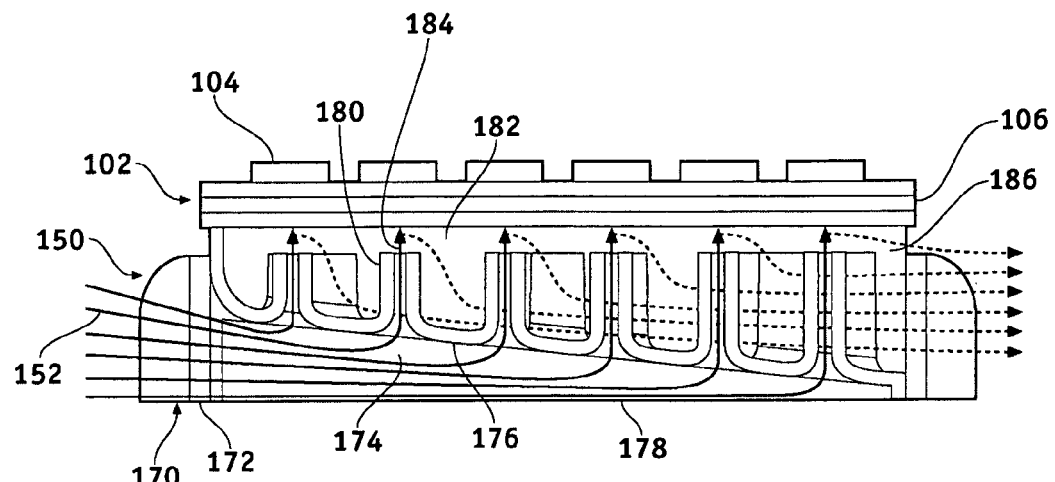
FIG. 2 is a simplified side cross-sectional view of the power module of FIG. 1.

FIG. 2 is a simplified cross-sectional view of the power module 100, including portions of the cooling system 150 and the semiconductor device 102. As discussed above, the cooling system 150 delivers a flow of coolant 152 to the substrate 106 of the semiconductor device 102 via the coolant diverter 170. The coolant diverter 170 includes an inlet 172 to receive the coolant 152 from the inlet flow passage 154 (FIG. 1). In some embodiments, coolant 152 enters the inlet 172 with a flow direction parallel to the substrate 106. The coolant 152 flows from the inlet 172 into a first cavity 174. The first cavity 174 is at least partially defined by a first plate 176 and a second plate 178. The second plate 178 is generally parallel to the substrate 106 and the first plate 176 is generally at an angle to the second plate 178 and the substrate 106, thus resulting in the overall wedge-shape of the coolant diverter 170. The second plate 178 can be formed by the housing 108 as the coolant diverter 170 is positioned within the housing 108 or the second plate 178 can be part of the coolant diverter 170.

The relative orientation of the first and second plates 176, 178 results in the first cavity 174 having a cross-sectional area that decreases in a downstream direction. The first plate 176 includes a number of nozzles 180 that fluidly couple the first cavity 174 to a second cavity 182, which is formed by the first plate 176 and the underside of the substrate 106. The nozzles 180 are generally elongated tubes that extend into the second cavity 182. Although elongated nozzles 180 are illustrated in this exemplary embodiment, any structure for fluidly coupling the first cavity 174 to the second cavity 182 can be provided. In the depicted exemplary embodiment, the nozzles 180 extend to a position adjacent the underside of the substrate 106. As a result of the angled nature of the first plate 176, the length of the nozzles 180 increase in a downstream direction.

As the coolant 152 flows through the nozzles 180, jets 184 of coolant 152 are formed. The jets 184 impinge upon the substrate 106, and then drain via the first plate 176 out of the second cavity 182 as shown by the arrows. The coolant 152 then flows through an outlet 186 into the outlet flow passage 156. As the jets 184 of coolant 152 impinge upon the substrate 106, heat is transferred from the semiconductor device 102, through the substrate 106, to the coolant 152, thus providing a convective heat dissipation path and cooling the underside of the substrate 106.

As noted above, the angled orientation of the first and second plates 176, 178 that define the first cavity 174 result in the first cavity 174 having a cross-sectional area that decreases in a downstream direction. The second cavity 182 has a corresponding cross-sectional area that increases in a downstream direction due to the angled orientation between the second plate 178 and the substrate 106. This arrangement provides an even flow distribution across all of the jets 184. For example, the most upstream jet in FIG. 2 has approximately the same amount of coolant flow as the most downstream jet. Moreover, the nozzles 180 can be variously and individually sized such that the flow rates and pressure drops are equal throughout. Additionally, the nozzles 180 can be sized and arranged to deliver any desired amount of coolant 152 to any particular location on the substrate 106. In other words, the nozzles 180 can be "tuned" to flow in precise ratios and/or flow rates, including uneven flows. In some conventional cooling systems, which may have a first cavity that does not decrease in cross-sectional area or improperly sized nozzles, the flow of coolant is typically and undesirably concentrated at the downstream jets. Additionally, the exemplary arrangement of FIG. 2 can result in decreased pressure loss since the coolant flows through a path with a relatively small number of direction change, i.e., essentially up through one of the nozzles 180 and draining out of the second cavity 182. Conventional cooling systems may require a more circuitous path that results in undesirable pressure losses for the system.

The nozzles 180 can have any suitable arrangement. In one exemplary embodiment, the nozzles 180 are preferably positioned so as to direct one or more individual jets 184 of coolant 152 directly onto a location on the substrate 106 that corresponds to the IGBTs 104. In other words, the arrangement of nozzles 180 typically corresponds to the arrangement of the IGBTs 104. One or more nozzles 180 can correspond to each IGBT 104. The nozzles 180 may also provide coolant 152 to other components associated with the semiconductor device 102 and power module 100, such as capacitors, transformers, integrated circuits, wire bonds, and bus bars that may be temperature sensitive.

In an alternative embodiment, the nozzles can form a fine or atomized mist instead of a jet of coolant in a "free jet" system with air or a gas surrounding the jet nozzles. Relative to jet nozzles, spray nozzles may provide more efficient thermal cooling. Conversely, jets nozzles may permit the pump to be of the low pressure variety thereby reducing cost and increasing system reliability. The disclosed embodiments may provide the necessary cooling of the semiconductor device 102 without the use of a cold plate. Instead, the jets 184 of coolant 152 directly impinge on the underside of the substrate 106.

Since coolant 152 is applied directly to the source of heat of the IGBTs 104, the power density (power per unit volume) of the power module 100 can be increased. To be cooled by the coolant 152, heat generated by the IGBTs 104 need not unnecessarily conduct through multiple layers of materials, a few of which may have low thermal conductivity. Rather, a more direct thermal path provided by jet cooling reduces the temperature of the IGBTs 104. Compared to some prior art arrangements, the thermal path may not need to pass through a heatsink and thermal interface material. At lower temperatures, increased power may be available through the power module 100. Additionally, improved cooling improves the ability of the power module 100 to high power transient fluctuations.

Figure 3:
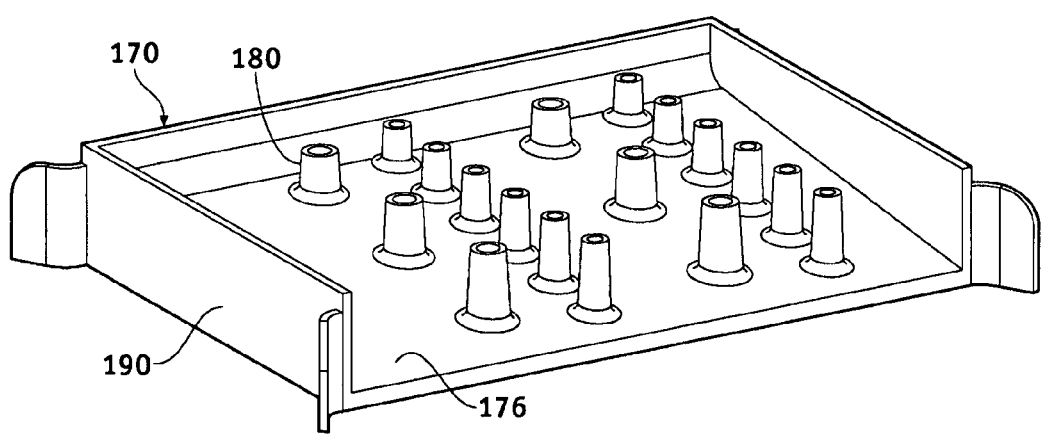
FIG. 3 is a top isometric view of an exemplary coolant diverter utilized in a cooling system of the power module of FIGS. 1 and 2.

FIG. 3 is a top, isometric view of the coolant diverter removed from the power module 100. The coolant diverter 170 has side walls 190 that bound the first and second cavities 174, 182. Generally, the first plate 176, nozzles 180, and side walls 190 are integrally formed from a single-piece, for example, with an injection molding process. The coolant diverter 170 can be manufactured with, for example, a thermoplastic material. In alternate embodiments, the coolant diverter 170 can be formed from separate pieces. As a whole, the cooling diverter 170 is wedge-shaped with a relatively compact and simple to make construction.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments.

What is claimed is:

1. A cooling device for liquid cooling a power semiconductor device, comprising:
   a coolant diverter for guiding liquid coolant to the power semiconductor device, the coolant diverter having a first plate for dividing the coolant diverter into a first cavity and a second cavity, the second cavity being positioned adjacent the power semiconductor device,
   the first plate further including a plurality of nozzles to fluidly couple the first cavity with the second cavity such that the liquid coolant flows into the first cavity, through the opening in the first plate, and into the second cavity to cool the power semiconductor device,
   the first cavity having a cross-sectional area that generally decreases in a downstream direction and the second cavity having a cross-sectional area that generally increases in the downstream direction, wherein each of the plurality of nozzles has a length and wherein the lengths increase in the downstream direction.

2. The cooling device of claim 1, further comprising side plates that at least partially form the first and second cavities with the first plate.

3. The cooling device of claim 1, wherein the first plate and the plurality of nozzles are integral with one another.

4. The cooling device of claim 1, wherein the plurality of nozzles include a first nozzle having a first diameter and a second having nozzle a second diameter, the second diameter having a different value from the first diameter.

5. The cooling device of claim 4, wherein the first and second diameters are sized such that pressure drops of the liquid coolant through the first and second openings are approximately equal.

6. The cooling device of claim 1, wherein the liquid coolant flows through the opening into the second cavity, strikes the underside of semiconductor device, drains back onto the first plate, and flows directly into the outlet.

7. The cooling device of claim 1, wherein the liquid coolant flows from the inlet into the first cavity, and directly through the opening.

8. The cooling device of claim 1, further comprising a second plate forming the first cavity with the first plate, and wherein the first plate is arranged generally non-parallel to the second plate and to the semiconductor device and the second plate is generally parallel to the semiconductor device.

* * * * *